United States Patent
Kwon et al.

(10) Patent No.: US 8,644,714 B2
(45) Date of Patent: Feb. 4, 2014

(54) MULTI-WAVELENGTH OPTICAL SOURCE GENERATOR

(75) Inventors: Oh-Kee Kwon, Daejeon (KR); Chul-Wook Lee, Daejeon (KR); Dong-Hun Lee, Daejeon (KR); Young Ahn Leem, Daejeon (KR); Yongsoon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 132 days.

(21) Appl. No.: 13/325,076

(22) Filed: Dec. 14, 2011

(65) Prior Publication Data

US 2012/0163821 A1  Jun. 28, 2012

(30) Foreign Application Priority Data

Dec. 22, 2010 (KR) .......................... 10-2010-0132324

(51) Int. Cl.
*H04B 10/12* (2011.01)

(52) U.S. Cl.
USPC ............... 398/201; 398/200; 398/79; 398/87; 398/68

(58) Field of Classification Search
USPC ............... 398/201, 200, 196, 182, 79, 87, 84, 398/192, 68; 385/14, 10, 37, 47, 12, 123, 385/131
See application file for complete search history.

(56) References Cited

U.S. PATENT DOCUMENTS

| | | | | |
|---|---|---|---|---|
| 5,134,671 A * | 7/1992 | Koren et al. | | 385/14 |
| 5,282,260 A * | 1/1994 | Buchal et al. | | 385/132 |
| 5,288,659 A * | 2/1994 | Koch et al. | | 438/31 |
| 5,394,489 A * | 2/1995 | Koch | | 385/14 |
| 5,479,544 A * | 12/1995 | Ono et al. | | 385/37 |
| 5,576,881 A * | 11/1996 | Doerr et al. | | 359/333 |
| 5,784,183 A * | 7/1998 | Aoki et al. | | 398/91 |
| 5,818,986 A * | 10/1998 | Asawa et al. | | 385/24 |
| 6,055,250 A * | 4/2000 | Doerr et al. | | 372/23 |
| 6,275,317 B1 * | 8/2001 | Doerr et al. | | 398/201 |
| 6,321,011 B2 * | 11/2001 | Deacon | | 385/50 |
| 6,400,864 B1 * | 6/2002 | Lee | | 385/24 |
| 6,434,175 B1 * | 8/2002 | Zah | | 372/20 |
| 6,603,559 B2 * | 8/2003 | Tsao et al. | | 356/479 |
| 7,136,553 B2 * | 11/2006 | Kwon et al. | | 385/37 |
| 7,424,041 B2 * | 9/2008 | Meliga et al. | | 372/20 |
| 7,489,838 B2 * | 2/2009 | Kish et al. | | 385/14 |
| 7,546,011 B2 | 6/2009 | Kwakernaak et al. | | |
| 7,680,416 B2 * | 3/2010 | Hann et al. | | 398/85 |
| 8,326,154 B2 * | 12/2012 | Poustie et al. | | 398/82 |
| 8,417,118 B2 * | 4/2013 | Bai | | 398/65 |
| 8,521,038 B1 * | 8/2013 | Wach | | 398/200 |
| 2002/0001432 A1 * | 1/2002 | Ueda | | 385/37 |
| 2007/0147762 A1 * | 6/2007 | Kwakernaak et al. | | 385/131 |
| 2007/0160326 A1 * | 7/2007 | Kwakernaak et al. | | 385/37 |
| 2008/0019638 A1 * | 1/2008 | Kwon et al. | | 385/29 |
| 2010/0284019 A1 * | 11/2010 | Fukuda | | 356/477 |

* cited by examiner

*Primary Examiner* — Daniel Washburn
*Assistant Examiner* — Hibret Woldekidan
(74) *Attorney, Agent, or Firm* — Rabin & Berdo, P.C.

(57) ABSTRACT

Provided is a multi-wavelength optical source generator. The multi-wavelength optical source generator includes: a gain part generating a plurality of lights through a plurality of gain waveguides; a reflective part transmitting or reflecting lights provided from each of the plurality of gain waveguides according to a wavelength; and a multiplexing part multiplexing a plurality of lights transmitted and outputted through the reflective part.

11 Claims, 9 Drawing Sheets

MULTI-WAVELENGTH OPTICAL SOURCE GENERATOR

CROSS-REFERENCE TO RELATED APPLICATIONS

This U.S. non-provisional patent application claims priority under 35 U.S.C. §119 of Korean Patent Application No. 10-2010-0132324, filed on Dec. 22, 2010, the entire contents of which are hereby incorporated by reference.

BACKGROUND OF THE INVENTION

The present invention disclosed herein relates to an optical source generator, and more particularly, to a multi-wavelength optical source generator generating lights having a plurality of wavelengths sequentially or simultaneously.

Recently, as broadband internet and various multimedia services appear, a variety of techniques to provide mass information to users are in progress. Especially, diverse optical source devices are being developed to transmit information through optical fibers.

A multi-wavelength optical source generator is an optical source generator generating lights having a plurality of wavelengths sequentially or simultaneously. The multi-wavelength optical generator is mainly used in a Wavelength Division Multiplexing (WDM) optical system. Typically, an optical source generator comprises semiconductor materials (Group III-V materials) and amorphous silicon (hereinafter, referred to as a-Si). Light is generated after current is injected into a semiconductor material. The a-Si provides functions (such as guiding, wavelength selecting, and combining) with respect to the light that the semiconductor material generates. Moreover, the multi-wavelength optical source may be realized through the monolithic integration of a semiconductor material and a-Si.

A typical optical source generator may be formed with the monolithic integration of a semiconductor optical gain medium, an Arrayed Waveguide Grating (AWG), and a-Si. Additionally, instead of the AWG, a Concave Grating (CG) may be used for the typical optical source generator.

An operating wavelength of a monolithic integration type optical source device including a demultiplexer such as AWG and CG may be selected by adjusting a diffraction condition such as a diffraction order and a diffraction cycle. Additionally, the monolithic integration type optical source device including a demultiplexer may be easily realized only with patterning and etching through a lithography process. However, due the long length of a cavity, applications of the monolithic integration optical source device are limited.

SUMMARY OF THE INVENTION

The present invention provides a multi-wavelength optical source generator overcoming limitations caused by the length of a cavity.

Embodiments of the present invention provide a multi-wavelength optical source generator including: a gain part generating a plurality of lights through a plurality of gain waveguides; a reflective part transmitting or reflecting lights provided from each of the plurality of gain waveguides according to a wavelength; and a multiplexing part multiplexing a plurality of lights transmitted and outputted through the reflective part.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
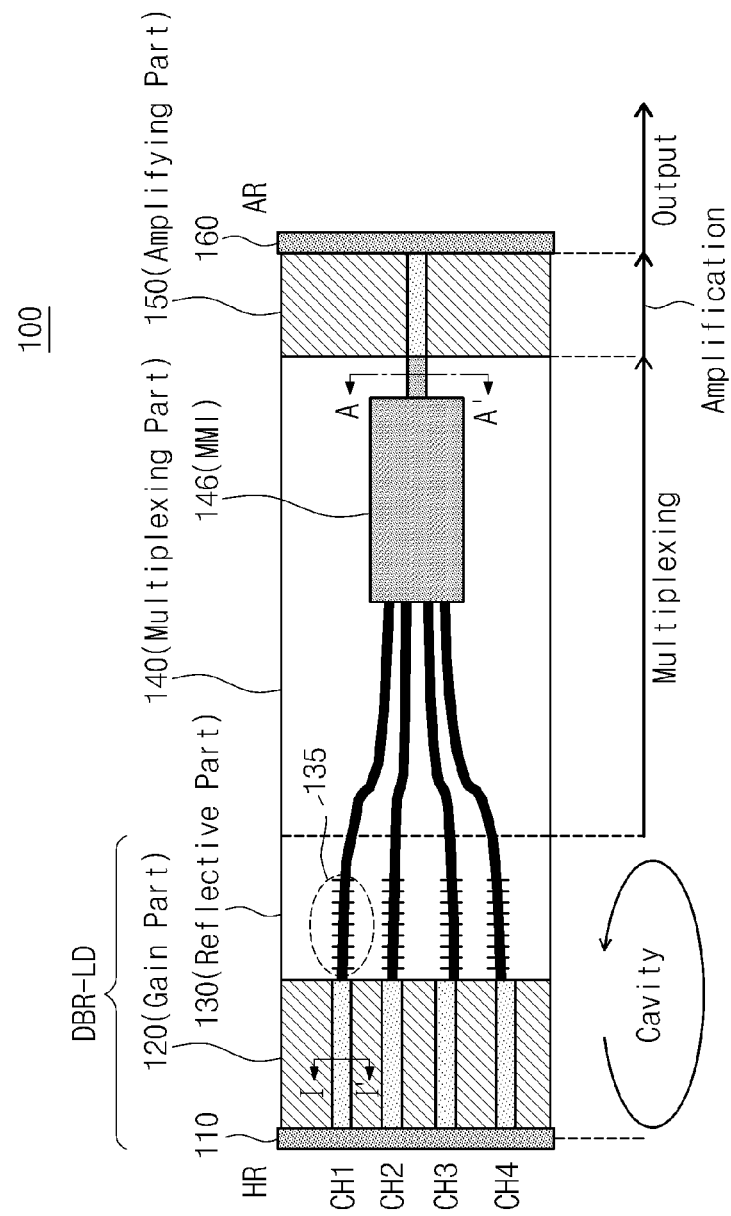
FIG. 1 is a view illustrating a multi-wavelength optical source generator according to an embodiment of the present invention.

It should be construed that foregoing general illustrations and following detailed descriptions are exemplified and an additional explanation of claimed inventions is provided. Reference numerals are indicated in detail in preferred embodiments of the present invention, and their examples are represented in reference drawings. In every possible case, like reference numerals are used for referring to the same or similar elements in the description and drawings. Preferred embodiments of the present invention will be described below in more detail with reference to the accompanying drawings.

In entire specification, the meaning of "include," "comprise," "including," or "comprising," specifies a property, a region, a fixed number, a step, a process, an element and/or a component but does not exclude other properties, regions, fixed numbers, steps, processes, elements and/or components.

Additionally, terms such as " . . . part", " . . . device", and " . . . apparatus" mean units for processing at least one function or operation and those may be realized with hardware, software, or a combination thereof.

When the length of a cavity in a multi-wavelength optical source generator is long, a modulation bandwidth, which is obtained through a direct modulation of a light source, is limited due to a long round time. Thus, a multi-wavelength optical source generator having a long cavity may be difficult to be used for a high speed communication (for example, more than about 2.5 Gbps). Additionally, when a demultiplexer such as an Arrayed Waveguide Grating (AWG) and a Concave Grating (CG) is used, a bandwidth of transmission spectrum, obtained from a planar waveguide, typically is about 0.3 nm at the wavelength of about 1550 nm. For example, if the length of a cavity is about 5 mm, since a Free Spectral Range (FSR) is about 0.065 nm, there are about four to five cavity modes in the transmission spectrum width. This greatly deteriorates single-mode characteristics and as a result of this, single mode stability is lowered. A multi-wavelength optical source generator selecting a wavelength only with AWG or CG has a narrow transmission spectrum width and due to this, a production yield is lowered and optical loss is increased.

FIG. 1 is a view illustrating a multi-wavelength optical source generator according to an embodiment of the present invention. Referring to FIG. 1, the multi-wavelength optical source generator 100 includes a gain part 120, a reflective part 130, and a multiplexing part 140.

A High reflection coating layer (i.e., HR) 110 is formed on a vertical section of the gain part 120 described later. Here, the high reflection coating layer 110 may include mirror devices having high reflection (almost 100%), a metal, or dielectric thin film coating surface.

The gain part 120 generates lights having a plurality of wavelengths. As shown in FIG. 1, the gain part 120 includes a plurality of channels, each channel generating a single mode light. FIG. 1 shows that a laser light having four wavelengths is generated by four channels but is not limited thereto. It is understood that the number of channels may vary according to various purposes. Each of the channels in the gain part 120 includes a gain waveguide to provide a gain to the generated light. The gain waveguide may have a quantum well structure to provide gain to the generated light. The gain waveguide in the gain part 120 may include a compound semiconductor (e.g., InGaAsP).

The reflective part 130 reflects lights incident from the gain waveguide of each channel toward the side of the gain part 120. The reflective part 130 may transmit a single mode light outputted through oscillation among lights incident from respective gain waveguides. The transmitted single mode light is delivered to the multiplexing part 140.

The reflective part 130 includes a plurality of reflection-type Bragg gratings 135 which selectively reflect lights incident from each channel of the gain part 120 according to a wavelength. The reflection-type Bragg gratings 135 may be formed on a clad through partial etching.

The reflection-type Bragg gratings 135 are formed to have a grating period so as to reflect a light of a specific wavelength. The reflection-type Bragg gratings 135 may be formed through a photolithography process. The reflection-type Bragg grating 135 may be formed through dry etching or wet etching. That is, the reflection-type Bragg gratings 135 may be formed of micro-grooves as an etching process is performed on a clad. A structure of the reflection-type Bragg gratings 135 will be described in more detail with reference to FIGS. 4 and 5.

Here, the high reflection coating layer 110, the gain part 120, and the reflective layer 130 constitute a Distributed Bragg Reflector-Laser Diode (DBR-LD) generating lights having a plurality of wavelengths.

The multiplexing part 140 multiplexes the single mode lights generated from each channel of the DBR-LD. The multiplexed light is delivered to an amplifying part 150 through a waveguide at an output side. The multiplexing part 140 may include an amorphous silicon Multi Mode Interference (MMI) 146. The amorphous silicon MMI 146 optically couples single mode lights having respectively different wavelengths. The amorphous silicon MMI 146 used as an optical combiner has a smaller size and a simpler structure than AWG. When the amorphous silicon MMI 146 is used as a multiplexer, it increases a production yield of the multi-wavelength optical source generator 100 and reduces waveguide loss than AWG.

The amplifying part 150 receives an output of the amorphous silicon MMI 146 in the multiplexing part 150. The amplifying part 150 amplifies the received multiplexed light and outputs it. The amplifying part 150 may include a Semiconductor Optical Amplifier (SOA) formed of a semiconductor compound (e.g., InGaAsP). The SOA is used to increase an optical output of the multi-wavelength optical source generator 100. Like the gain part 120, the InGaAsP SOA may include a gain waveguide and an upper clad. The gain waveguide is formed on an N_InP substrate and the upper clad is formed on the gain waveguide.

Optical coupling efficiency between the InGaAsP SOA and the amorphous silicon MMI 146 in the multiplexing unit part 140 should be higher like the above-mentioned optical coupling efficiency of the gain part 120 and the reflective part 130. If high optical coupling efficiency is guaranteed, lights scattered and radiated due to a mode mismatch can be blocked.

An anti reflection coating layer (i.e., AR) 160 is formed on a vertical section at an output side of the amplifying part 150. The anti reflection coating layer 160 is formed to minimize a phenomenon that light processed in the multiplexing part 140 and the amplifying part 150 is reflected at an output stage. If an output light is reflected at the vertical section at the output side of the amplifying part 150 and then again is incident toward the amplifying part 150, the multiplexing part 140, and the DBR-LD, unintended feedback effect may occur.

Here, the multi-wavelength optical source generator 100 may selectively include the high reflection coating layer 110, the amplifying part 150, and the anti reflection coating layer 160. For example, even when at least one of the high reflection coating layer 110, the amplifying part 150, and the anti reflection coating layer 160 is excluded, the multi-wavelength optical source generator 100 may maintain its functions and effects. If the amplifying part 150 is excluded, the anti reflection coating layer 160 may be formed on the vertical section at an output side of the multiplexing part 140.

According to the multi-wavelength optical source generator 100, the length of a cavity for generating a single mode light may be reduced. If the length of a cavity is short, a short round-time is provided. Accordingly, limitations on a modulation bandwidth obtained through direct modulation on a light source may be reduced. As a result, the multi-wavelength optical source generator 100 may be used as an optical source of a high speed communication (for example, equal to or greater than about 2.5 Gbps). Since a short cavity has a relatively broad free spectral range, the stability of the generated single mode light may be improved. Also, the amorphous silicon MMI 146 in the multiplexing part 140 has a small size and a simple structure. Accordingly, the multi-wavelength optical source generator 100 can be manufactured to have a high production yield and a low waveguide loss.

Figure 2:
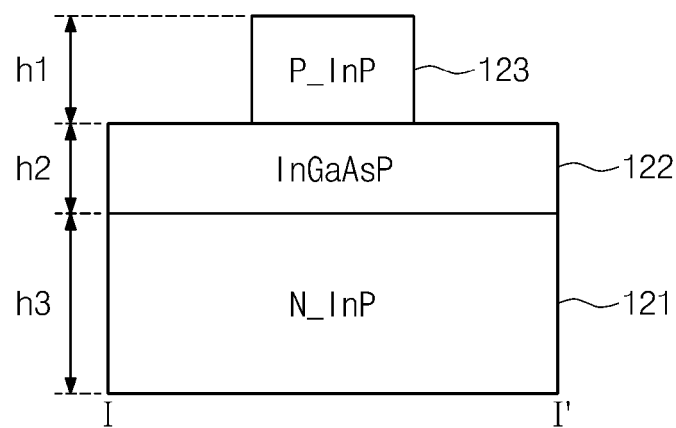
FIG. 2 is a sectional view of a waveguide in the gain part or the amplifying part of FIG. 1.

FIG. 2 is a sectional view of a waveguide in the gain part 120 or the amplifying part 150 of FIG. 1. Hereinafter, the waveguide in the gain part 120 or the amplifying part 150 is referred to as a gain waveguide. Referring to FIG. 2, it shows a section taken along the line I-I' of the gain part 120 of FIG. 1. The gain waveguide includes a core 122 and a clad 123, on a substrate 121.

The substrate 121 may be formed of N_InP having a thickness h1. The core 122 may be formed of InGaAsP having a thickness h2 with a bulk or quantum well structure. The clad 123 may be formed of P_InP having a thickness h3. Here, the substrate 121 and the clad 123 have a refractive index of about 3.17 and the core 122 may have a refractive index of about 3.35.

Figure 3:
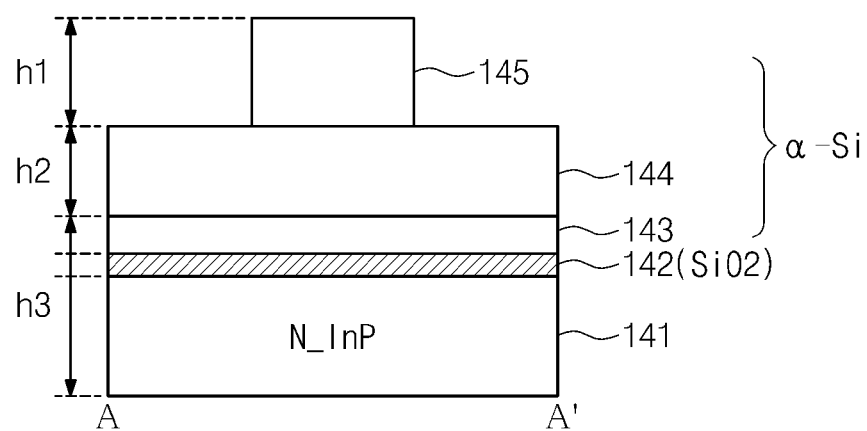
FIG. 3 is a sectional view of a waveguide in the reflective part or the multiplexing part of FIG. 1.

FIG. 3 is a sectional view of a waveguide in the reflective part 130 or the multiplexing part 140 of FIG. 1. Hereinafter, the waveguide in the reflective part 130 or the multiplexing part 140 may be referred to as an amorphous silicon waveguide. Referring to FIG. 3, it shows a section taken along the line A-A' of the amorphous silicon waveguide in the multiplexing part 140 of FIG. 1.

The amorphous silicon waveguide should be designed to have a high optical coupling efficiency with respect to the gain waveguide. The amorphous silicon waveguide includes a substrate 141, a silicon dioxide layer 142, a lower amorphous silicon clad 143, an amorphous silicon core 144, and an upper amorphous silicon clad 145.

The substrate 141 of the amorphous silicon waveguide is formed of N_InP and the silicon oxide layer 142 is formed on the substrate 141. Due the formation of the silicon oxide layer 142, it prevents an N_InP impurity in the substrate 141 from being diffused into the amorphous silicon layers 143, 144, and 145. The lower amorphous silicon clad 143 is formed on the silicon oxide layer 142. The amorphous silicon core 144 is formed on the lower amorphous silicon clad 143. The upper amorphous silicon clad 145 is formed on the amorphous silicon core 144.

Here, in order for optical coupling of the amorphous silicon waveguide and the gain waveguide, the amorphous silicon core 144 and the upper amorphous silicon clad 145 may be formed with the same refractive index and thickness as the core 122 and the clad 123, respectively. An entire thickness of the lower amorphous silicon clad 143 may be formed identical to that h3 of the substrate 121 in the gain waveguide.

Furthermore, a reflective index of the silicon oxide layer 142 may be lower than that of amorphous silicon. Accordingly, a waveguide mode is changed according to the thicknesses of the silicon oxide layer 142 and the lower amorphous silicon clad 143 and as a result of this, optical coupling characteristics of the amorphous silicon waveguide and the gain waveguide may be changed. Accordingly, the thicknesses and refractive indices of the silicon oxide layer 142 and the lower amorphous silicon clad 143 should be determined in consideration of the above changes.

Figure 4:
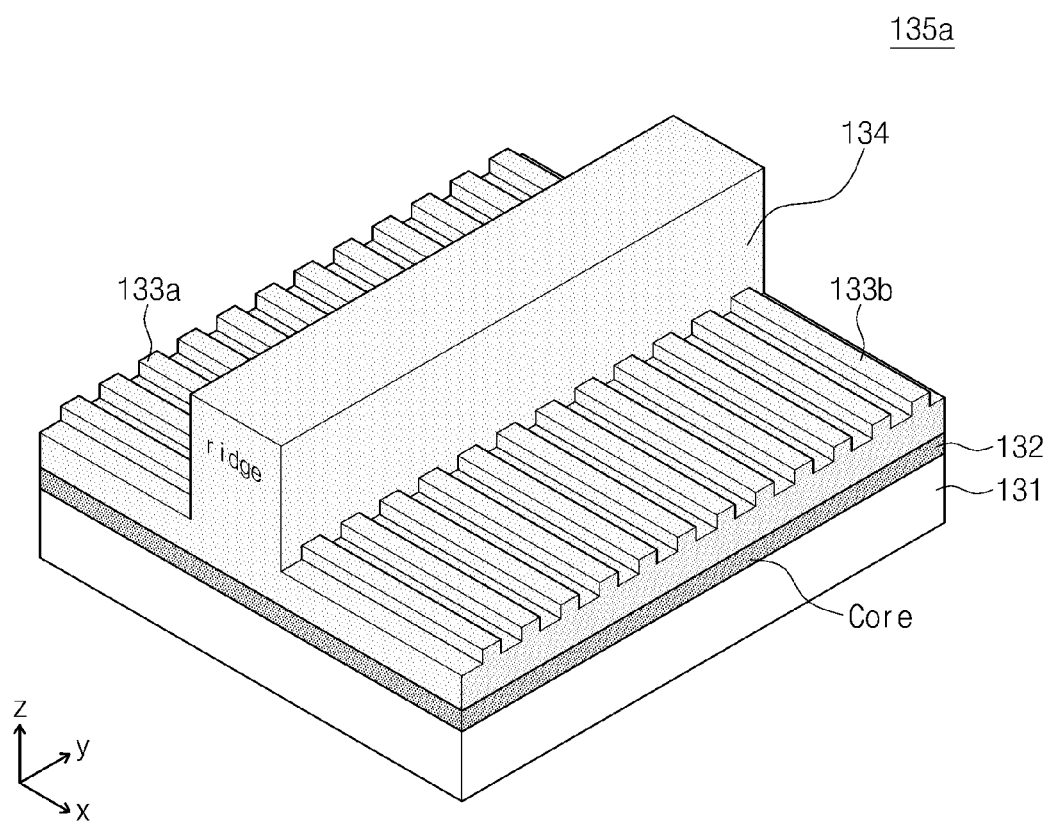
FIG. 4 is a perspective view illustrating a structure of the reflection-type Bragg grating.

FIG. 4 is a perspective view illustrating a structure of the reflection-type Bragg grating 135. Referring to FIG. 4, the reflection-type Bragg grating 135 may include Bragg gratings 133a and 133b at both sides of a ridge 134.

In order to form the reflection-type Bragg grating 135, a core 132 is formed on a substrate 131. A clad is formed on the core 132 to form a ridge waveguide. The Bragg gratings 133a and 133b for selecting a light having a specific waveguide are formed at both sides of the ridge 134. The Bragg gratings 133a and 133b have excellent characteristics in selectively reflecting or diffracting a wavelength band of a narrow region. Accordingly, a Bragg grating is manufactured with various forms and structures, so that it is may be extensively utilized in a wide field such as a filter, a resonator, a coupler, a diffractometer, a sensor, an optical pulse compressor, and a dispersion compensator. Especially, the Bragg gratings 133a and 133b may be easily manufactured with a waveguide form. According to a grating period Λ corresponding to an interval between the gratings, lights in respectively different wavelength bands are reflected. However, it is apparent that forms or structures of the Bragg gratings 133a and 133b are not limited to FIG. 4.

The reflection-type Bragg grating 135 may be diversely realized in an InGaAsP/InP waveguide through a two-beam hologram, E-beam, or lithography process. Additionally, the reflection-type Bragg grating 135 may be formed with a ridge or buried heterostructure type structure.

Figure 5:
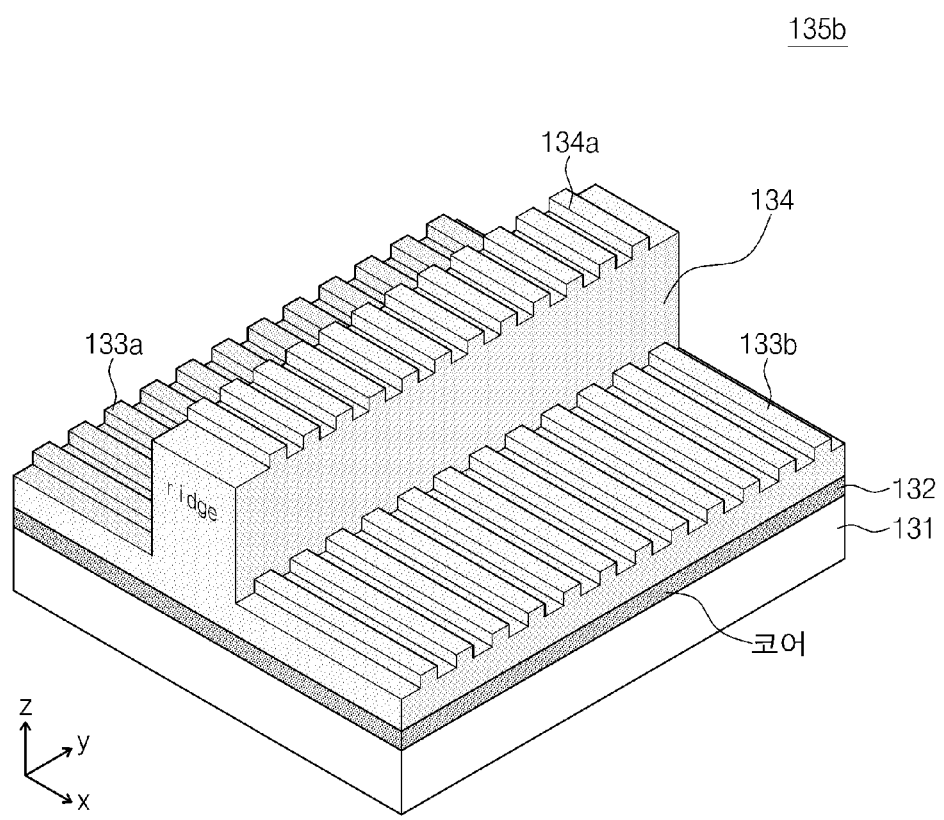
FIG. 5 is a perspective view illustrating another example of the reflection-type Bragg grating of FIG. 1.

FIG. 5 is a perspective view illustrating another example of the reflection-type Bragg grating 135 of FIG. 1. Referring to FIG. 5, a reflection-type Bragg grating 135b includes Bragg gratings 133a and 133b at both sides of a ridge 134 and a Bragg grating 134a on the ridge 134. It is apparent that formations of the reflection-type Bragg grating 135 are not limited to FIGS. 4 and 5.

Figure 6:
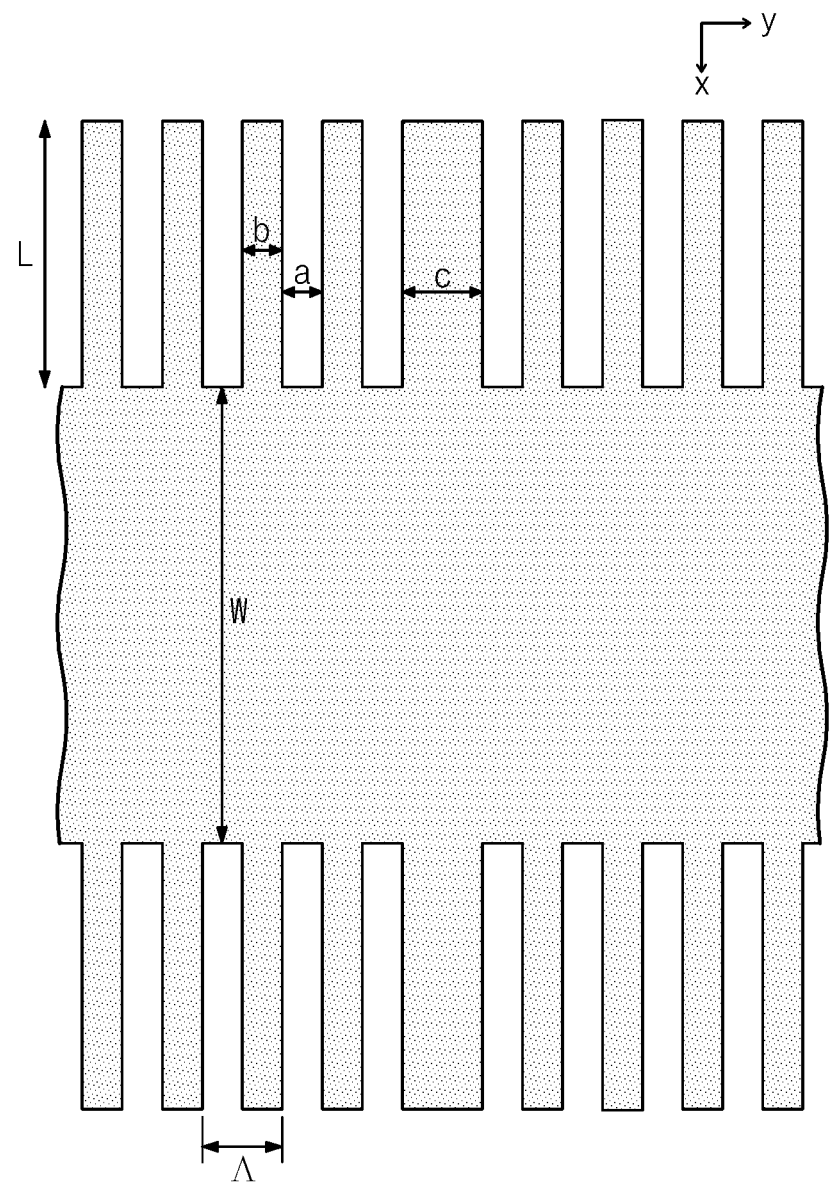
FIG. 6 is a sectional view illustrating components determining the reflectivity of the reflection-type Bragg grating.

FIG. 6 is a sectional view illustrating components determining the reflectivity of the reflection-type Bragg grating 135. Referring to FIG. 6, the reflection-type Bragg grating 135 may adjust reflectivity with respect to a specific wavelength according to setting values of a grating period Λ, a ridge width W, a grating length L, and grating widths a, b, and c. Moreover, the reflectivity of the reflection-type Bragg grating 135 may be set by the reflectivity of a waveguide.

Figure 7:
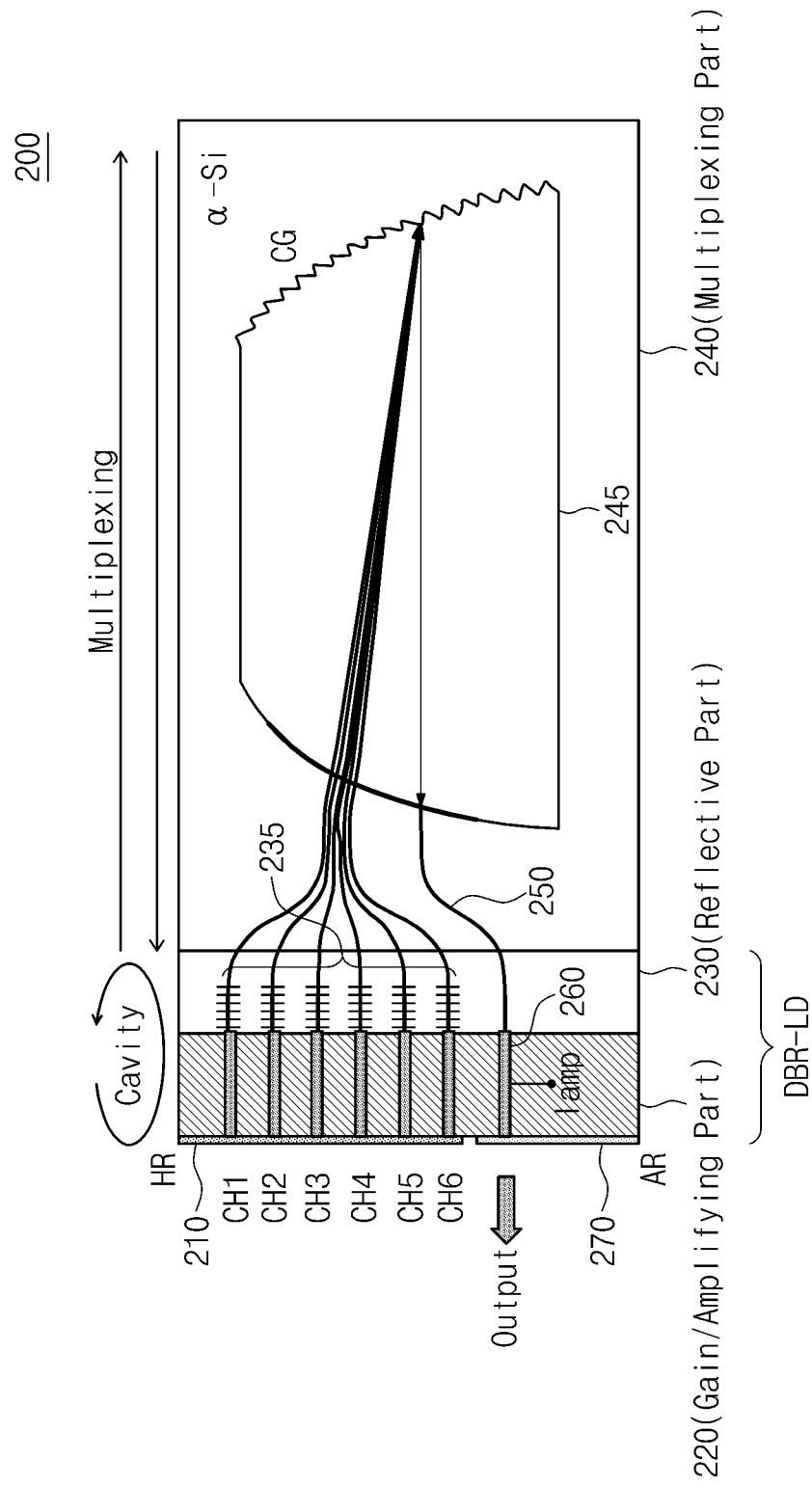
FIG. 7 is a view illustrating a multi-wavelength optical source apparatus according to another embodiment of the present invention.

FIG. 7 is a view illustrating a multi-wavelength optical source apparatus according to another embodiment of the present invention. Referring to FIG. 7, a multi-wavelength optical source apparatus 200 basically includes a gain/amplifying part, a reflective part 230, and a multiplexing part 240.

A high reflection coating layer (i.e., HR) 210 is formed on a vertical section of the gain/amplifying part 220. Here, the high reflection coating layer 210 may include mirror devices having high reflection (almost 100%), a metal, or dielectric thin film coating surface.

The gain/amplifying part 220 generates and multiplexes lights having a plurality of wavelengths, amplifies the multiplexed light, and outputs the amplified light to the external. As shown in FIG. 7, a configuration generating a single mode light from the gain/amplifying unit 220 is similar to that from the gain part 120 of FIG. 1. Here, the number of channels CH1 to CH6 may vary according to a designer or a design purpose. Each of the channels CH1 to CH6 generates single mode light. The gain/amplifying part 220 provides gain to the generated lights and for this, may have a quantum well structure. The gain/amplifying part 220 may be formed to include a compound semiconductor (e.g., InGaAsP).

The gain/amplifying part 220 amplifies the light multiplexed into the multiplexing part 240 and outputs it. For an amplification function of the gain/amplifying part 220, an electrode for providing gain current lamp may be formed on the waveguide 260. The multiplexed light may be modulated or amplified by the gain current lamp and then may be delivered to an output stage formed of an anti reflection coating layer 270.

The reflective part 230 reflects the lights incident from each of the channels in the gain/amplifying part 220 toward the gain/amplifying part 220 again. The reflective part 230 may include a reflection-type Bragg grating 235. The reflection-type Bragg grating 235 may be formed through partial etching on an upper clad of a passive waveguide. The reflection-type Bragg grating 235 may be formed to have a grating period so as to reflect a light of a specific wavelength. The reflection-type Bragg grating 235 may be formed through a photolithography process. The reflection-type Bragg grating 235 may be formed through dry etching or wet etching. That is, the reflection-type Bragg grating 235 may be formed of micro-groove as an etching process is performed on a clad. A structure of the reflection-type Bragg grating 235 was described in more detail with reference to FIGS. 4 and 6.

Here, the high reflection coating layer 210, the gain part 220, and the reflective layer 230 constitute a DBR-LD generating lights having a plurality of wavelengths.

The multiplexing part 240 multiplexes single mode lights generated from each channel of the DBR-LD. The multiplexed light is delivered to the gain/amplifying part 220 through a waveguide at an output side. The multiplexing part 240 may include a concave grating 245. The concave grating 245 multiplexes single mode lights generated in each channel. The concave grating 245 may be applied when the number of input channels is greater than a reference value. The reason is that the concave grating 245 may have less optical add/drop loss even when the number of channels is larger than the amorphous silicon MMI.

In the above multi-wavelength optical source apparatus 200, the length of a cavity for generating a single mode light is very short. Accordingly, a round time of light is short and a high speed direct modulation is possible. Additionally, since a short cavity has a relatively broad free spectral range, the stability of generated single mode light may be improved. Moreover, the concave grating 245 may provide an efficient multiplexing operation when the number of channels is relatively large.

An anti reflection coating layer 270 is formed on a vertical section at an output side of the gain/amplifying part 220. The anti reflection coating layer 270 may be formed to minimize a phenomenon that the lights processed in the multiplexing part 240 and the gain/amplifying part 200 are reflected at the output stage. Here, the multi-wavelength optical source generator 200 may selectively include the high reflection coating layer 210 and the anti reflection coating layer 270.

According to the multi-wavelength optical source generator 200, the length of a cavity for generating a single mode light may be reduced. If the length of a cavity is short, a short round-time is provided. Accordingly, limitations on a modulation bandwidth obtained through direct modulation on a light source may be reduced. As a result, the multi-wavelength optical source generator 200 may be used as an optical source of a high speed communication (for example, more than about 2.5 Gbps). Since a short cavity has a relatively broad free spectral range, the stability of generated single mode light may be improved. Also, the concave grating 245 in the multiplexing part 240 may provide an efficient multiplexing operation even when the number of channels is relatively large.

Figure 8:
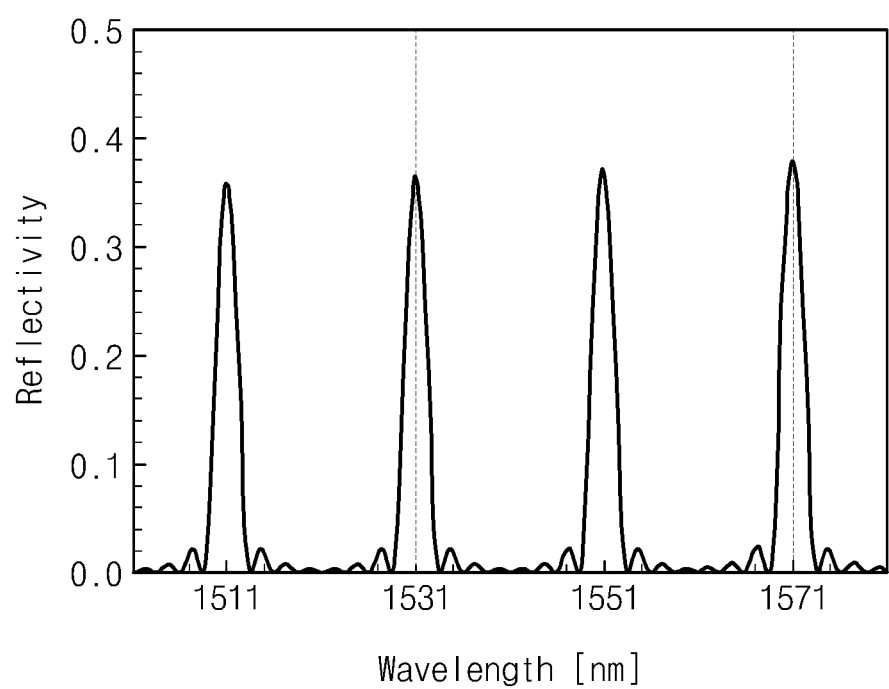
FIG. 8 is a graph illustrating characteristics of the reflection-type Bragg grating constituting the reflective parts.

FIG. 8 is a graph illustrating characteristics of the reflection-type Bragg grating 135 or 235 constituting the reflective parts 130 and 230 of FIG. 1 and FIG. 7. Referring to FIG. 8, the reflection-type Bragg grating 135 or 235 has reflectance characteristics under a condition to form a cavity having the width of about 1 mm. for example, the reflection-type Bragg grating 135 or 235 measures its reflectivity with a twelfth diffraction order, a grating period A of about 2.764 μm, a grating interval between channels of about 37 nm, a coupling coefficient of about 50 $cm^{-1}$ in a diffraction grating, and a diffraction grating length L of about 140 μm. In this case, the reflection-type Bragg grating 135 or 235 provides the maximum reflectivity (about 0.35) at wavelengths of about 1511 nm, about 1531 nm, about 1551 nm, and about 1571 nm.

Figure 9:
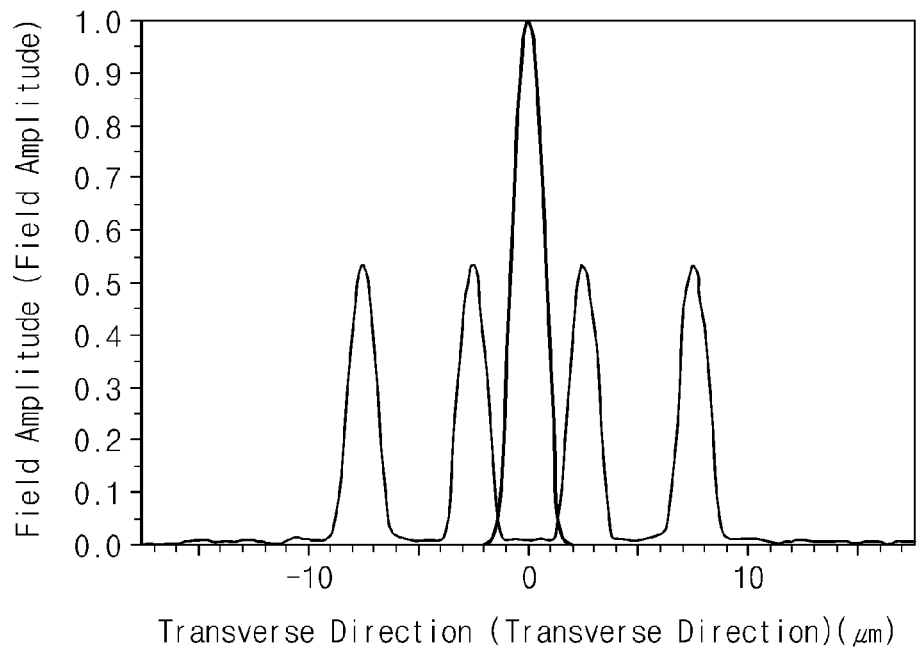
FIG. 9 is a graph illustrating operating characteristics of the amorphous silicon MMI of FIG. 1.

FIG. 9 is a graph illustrating operating characteristics of the amorphous silicon MMI 146 of FIG. 1. Referring to FIG. 9, lights of four channels are multiplexed through the amorphous silicon MMI 146. Operating conditions of the amorphous silicon MMI 146 are as follows. The amorphous silicon MMI 146 is formed with the length of about 220 μm and the width of about 22 μm. At this point, excellent multiplexing characteristics of single mode lights provided from four channels may be obtained.

Figure 10:
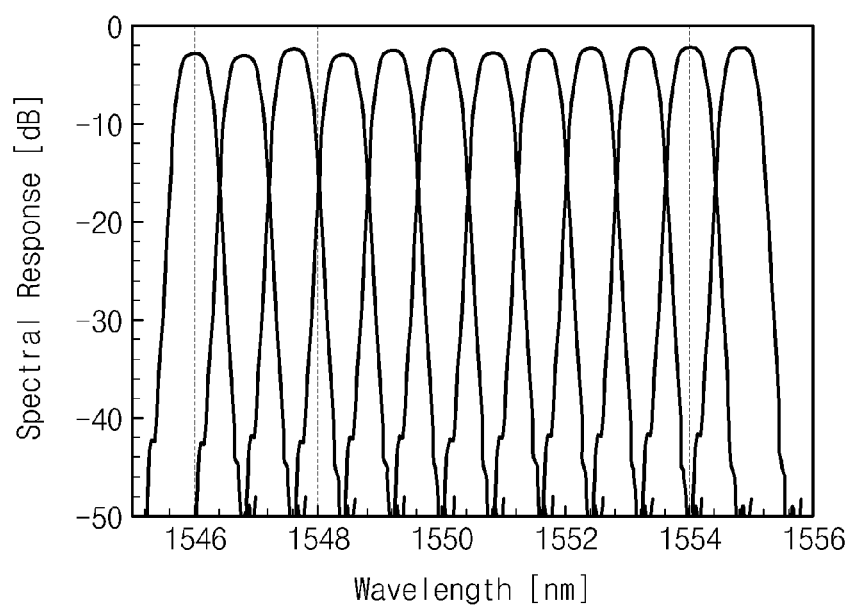
FIG. 10 is a graph illustrating a spectral response of the concave grating in the multi-wavelength optical source apparatus.

FIG. 10 is a graph illustrating a spectral response of the concave grating 245 in the multi-wavelength optical source apparatus 200. Referring to FIG. 10, it is confirmed that the concave grating 245 including 12 channels has a high crosstalk of about 40 dB and excellent transmission characteristics. Design values of the concave grating 245 are as follows. It is assumed that the concave grating 245 has a radius R of about 7.8 mm, a grating period of about 5.4 μm, and a sixteenth diffraction order. It is assumed that an incidence angle of the light from each channel is about 47° and the number of gratings is 600.

Figure 11:
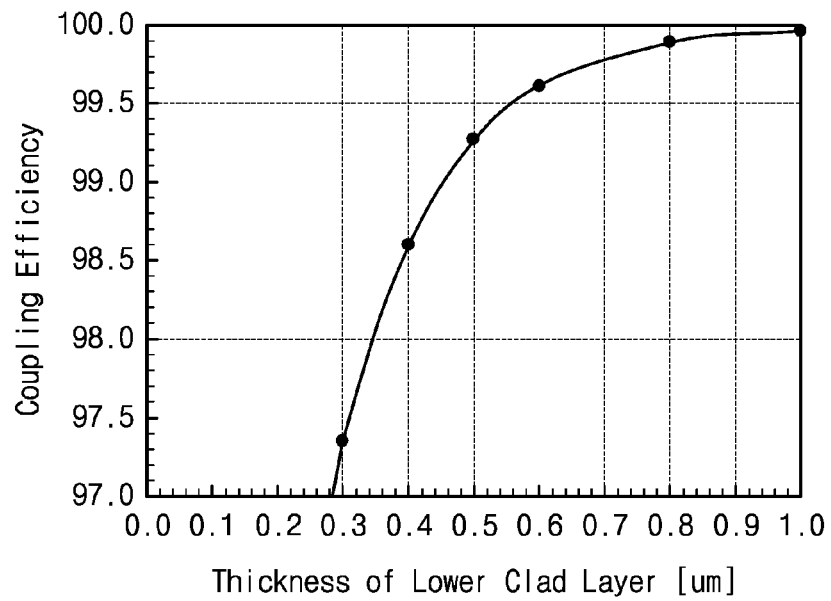
FIG. 11 is a graph illustrating optical coupling efficiency according to a thickness change of a lower clad in an amorphous silicon waveguide structure.

FIG. 11 is a graph illustrating optical coupling efficiency according to a thickness change of a lower clad in an amorphous silicon waveguide structure. In FIG. 11, it is assumed that the thickness t of the silicon oxide layer is about 0.2 μm in consideration of a typical thickness, which is used in an optical device manufacturing process, and the thickness of the lower clad is changed from about 0 μm to about 1 μm.

In the above condition, coupling efficiency of the amorphous silicon waveguide and the waveguide formed of a compound semiconductor (e.g., InGaAsP) is directly associated with a phenomenon (lights that are not optically coupled due to a mode mismatch are internally reflected between areas). As a result, this phenomenon affects wavelength selection characteristics of diffraction gratings. Accordingly, a waveguide structure for providing high optical coupling efficiency should be provided. Generally, in the integrated single mode optical source, the internal reflection needs to be less than about 0.1% and the optical coupling efficiency needs to be at least more than about 99% in consideration of lights diffused and radiated due to a mode mismatch.

Referring to FIG. 11, it is confirmed that optical coupling efficiency is more than about 99% when the thickness of the lower clad is more than about 0.5 μm. Additionally, it is expected that even when the thickness of the lower clad is thinner than about 0.5 μm with a reduced thickness of the silicon oxide layer, high optical coupling efficiency can be obtained.

Figure 12:
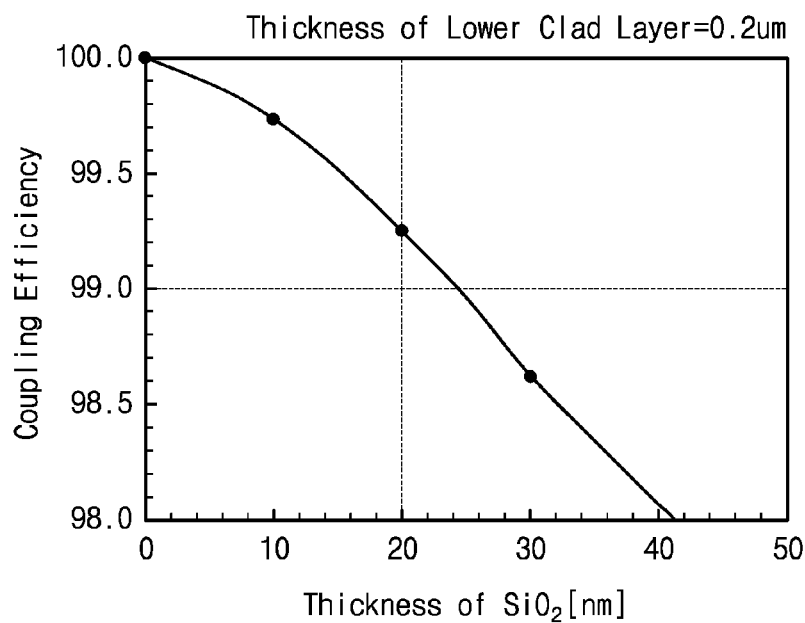
FIG. 12 is a graph illustrating optical coupling efficiency according to a thickness change of a silicon oxide layer in a waveguide structure formed of amorphous silicon.

FIG. 12 is a graph illustrating optical coupling efficiency according to a thickness change of a silicon oxide layer in a waveguide structure formed of amorphous silicon. The thickness of the lower clad layer is about 0.2 μm, which is thinner than 0.5 μm of FIG. 11 and the thickness of the silicon oxide layer is changed from about 0 nm to about 50 nm. It is confirmed that if the thickness t of the silicon oxide layer is less than about 20 nm, optical coupling efficiency is greater than about 99%.

If the silicon oxide layer having a thickness of less than about 20 nm is used as shown in FIG. 12, the thickness of the lower clad layer may be formed to be thinner. Thus, the stress of the lower clad may be reduced and surface roughness may be improved. As a result, device reliability can be improved through thickness adjustment of the silicon oxide layer.

According to the above-mentioned embodiments of the present invention, a multi-wavelength optical source generator may increase a modulation speed of an optical source, which is limited due to the length of a cavity. Additionally, the optical source generator can provide high single mode stability, a high yield according to transmission spectrum, reduction of optical loss, improvement of device reliability, and high optical coupling efficiency.

The above-disclosed subject matter is to be considered illustrative, and not restrictive, and the appended claims are intended to cover all such modifications, enhancements, and other embodiments, which fall within the true spirit and scope of the present invention. For example, detailed configurations of a gain part, a reflective part, a multiplexing part, and an amplifying part may be amended or modified according to their environments or uses. Thus, to the maximum extent allowed by law, the scope of the present invention is to be determined by the broadest permissible interpretation of the following claims and their equivalents, and shall not be restricted or limited by the foregoing detailed description.

What is claimed is:

1. A multi-wavelength optical source generator comprising:
   a gain part generating a plurality of lights through a plurality of gain waveguides;
   a reflective part transmitting or reflecting lights provided from each of the plurality of gain waveguides according to a wavelength; and
   a multiplexing part multiplexing a plurality of lights transmitted and outputted through the reflective part,
   wherein each of the plurality of gain waveguides comprises:
      a core on a substrate; and
      a clad on the core,
   wherein the reflective part comprises a plurality of amorphous silicon waveguides that are optically coupled with the plurality of gain waveguides, respectively,
   wherein each of the plurality of amorphous silicon waveguides comprises:
      a silicon oxide layer on the substrate;
      a lower amorphous silicon clad layer on the silicon oxide layer;
      an amorphous silicon core on the lower amorphous silicon clad layer; and
      an upper amorphous silicon clad layer on the amorphous silicon core,
   wherein each of the plurality of amorphous silicon waveguides is formed with a ridge type waveguide, and
   wherein each of the plurality of amorphous silicon waveguides comprises a reflective Bragg diffraction grating region.

2. The multi-wavelength optical source of claim 1, wherein the multiplexing part comprise an amorphous silicon Multi Mode Interference (MMI) that optically couples the plurality of lights.

3. The multi-wavelength optical source of claim 1, wherein the multiplexing part comprises a Concave Grating (CG) which optically couples the plurality of lights.

4. The multi-wavelength optical source of claim 3, further comprising an amplifying part amplifying an output light of the CG according gain current.

5. The multi-wavelength optical source of claim 4, wherein the amplifying part is formed in a compound semiconductor region where the gain part is formed.

6. The multi-wavelength optical source of claim 5, further comprising an anti reflection coating layer on a vertical section where a light amplified by the amplifying part is outputted.

7. The multi-wavelength optical source of claim 1, further comprising a high reflection coating layer on a vertical section of the gain part.

8. The multi-wavelength optical source of claim 7, wherein the high reflective coating layer, the gain part, and the reflective part constitute a distributed Bragg reflector laser diode outputting a plurality of single mode lights.

9. The multi-wavelength optical source of claim 1, further comprising an amplifying part amplifying an output of the multiplexed light outputted from the multiplexing part.

10. The multi-wavelength optical source of claim 9, further comprising an anti reflection coating layer on a vertical section of the amplifying part.

11. The multi-wavelength optical source of claim 9, wherein the reflective part and the multiplexing part comprise an amorphous silicon waveguide and the gain part and the amplifying part comprises a compound semiconductor waveguide.

* * * * *